(12) United States Patent
Gong (10) Patent No.: US 12,028,965 B2
(45) Date of Patent: Jul. 2, 2024

(54) CIRCUIT BOARD AND METHOD FOR PREPARING SAME, AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventor: Qing Gong, Beijing (CN)

(73) Assignees: Chengdu BOE Optoelectronics Technology Co., Ltd., Sichuan P.R. (CN); BOE Technology Group Co., Ltd., Beijing (CN)

( * ) Notice: Subject to any disclaimer, the term of this patent is extended or adjusted under 35 U.S.C. 154(b) by 251 days.

(21) Appl. No.: 17/629,370

(22) PCT Filed: Mar. 10, 2021

(86) PCT No.: PCT/CN2021/080035
§ 371 (c)(1),
(2) Date: Jan. 22, 2022

(87) PCT Pub. No.: WO2021/213051
PCT Pub. Date: Oct. 28, 2021

(65) Prior Publication Data
US 2022/0256690 A1    Aug. 11, 2022

(30) Foreign Application Priority Data
Apr. 23, 2020   (CN) .......................... 202010330019.8

(51) Int. Cl.
*H05K 1/02*   (2006.01)
*H05K 1/09*   (2006.01)
*H05K 3/46*   (2006.01)

(52) U.S. Cl.
CPC .......... *H05K 1/0224* (2013.01); *H05K 1/092* (2013.01); *H05K 3/4644* (2013.01)

(58) Field of Classification Search
CPC .. H05K 1/0218; H05K 1/0219; H05K 1/0224; H05K 1/092; H05K 1/189;
(Continued)

(56) References Cited

U.S. PATENT DOCUMENTS

2004/0112636 A1 * 6/2004 Kawai ............... H01L 23/49855
257/E21.511
2008/0143358 A1   6/2008 Breinlinger
(Continued)

FOREIGN PATENT DOCUMENTS

CN        101321431 A     12/2008
CN        103140126 A      6/2013
(Continued)

OTHER PUBLICATIONS

International Search Report for PCT/CN2021/080035 Mailed Jun. 17, 2021.
(Continued)

*Primary Examiner* — Timothy J Thompson
*Assistant Examiner* — Guillermo J Egoavil
(74) *Attorney, Agent, or Firm* — Ling Wu; Stephen Yang; Ling and Yang Intellectual Property (57) ABSTRACT

A circuit board, including: a substrate; a first line layer, a first protective layer, a first conductive ink layer and a first conductive layer successively formed on the substrate; and a second line layer, a second protective layer, a second conductive ink layer and a second conductive layer successively formed on a second face opposite a first face. The first protective layer includes at least one first opening for exposing a first grounding line of the first line layer; and the orthographic projection of the first conductive ink layer on
(Continued)

the substrate covers the orthographic projection of the first opening on the substrate. The second protective layer includes at least one second opening for exposing a second grounding line of the second line layer; and the orthographic projection of the second conductive ink layer on the substrate covers the orthographic projection of the second opening on the substrate.

16 Claims, 4 Drawing Sheets

(58) Field of Classification Search
CPC .... H05K 1/02; H05K 1/09; H05K 2201/0715; H05K 2201/10128; H05K 3/4069; H05K 3/4644; H05K 3/46
USPC ........................................................ 174/251
See application file for complete search history.

(56) References Cited

U.S. PATENT DOCUMENTS

| | | | |
|---|---|---|---|
| 2008/0296048 | A1 | 12/2008 | Muro et al. |
| 2013/0140501 | A1* | 6/2013 | Nakabayashi ........... H01B 1/12 252/514 |
| 2014/0174796 | A1* | 6/2014 | Watanabe ............ H05K 1/0266 174/254 |
| 2014/0326484 | A1* | 11/2014 | Tajima .................... H05K 9/00 174/250 |
| 2018/0103540 | A1 | 4/2018 | Haruna et al. |

FOREIGN PATENT DOCUMENTS

| | | | | |
|---|---|---|---|---|
| CN | 105592620 | A | 5/2016 | |
| CN | 107683633 | A | 2/2018 | |
| CN | 111465175 | A | 7/2020 | |
| EP | 3242535 | A2 | 11/2017 | |
| FR | 3074399 | A1 | 5/2019 | |
| FR | 3074400 | A1 | 5/2019 | |
| FR | 3074400 | B1 * | 10/2019 | ............. H01P 3/082 |
| JP | H04-116884 | A | 4/1992 | |
| JP | H07-58485 | A | 3/1995 | |
| JP | H07-58488 | A | 3/1995 | |
| JP | H08-125380 | A | 5/1996 | |
| JP | H09-167525 | A | 6/1997 | |
| JP | 2000-269632 | A | 9/2000 | |
| KR | 1020160124344 | A | 10/2016 | |

OTHER PUBLICATIONS

The First Office Action dated Feb. 10, 2021 for Chinese Patent Application No. 202010330019.8 and English Translation.
The Second Office Action dated Aug. 5, 2021 for Chinese Patent Application No. 202010330019.8 and English Translation.
Decision of Rejection dated Nov. 23, 2021 for Chinese Patent Application No. 202010330019.8 and English Translation.

* cited by examiner

CIRCUIT BOARD AND METHOD FOR PREPARING SAME, AND ELECTRONIC DEVICE

CROSS-REFERENCE TO RELATED APPLICATIONS

The present application is a U.S. National Phase Entry of International Application PCT/CN2021/080035 having an international filing date of Mar. 10, 2021, which claims priority of Chinese Patent Application No. 202010330019.8, filed to the CNIPA on Apr. 23, 2020 and entitled "Circuit Board and Method for Preparing Same, and Electronic Device," the content of which should be construed as being incorporated into the present application by reference.

TECHNICAL FIELD

The present disclosure relates to, but is not limited to, the technical field of circuit board, in particular to a circuit board, a method for preparing the circuit board and an electronic device.

BACKGROUND

With continuous development of electronic products, in order to provide users with electronic products with stable and reliable performance, stricter requirements on designs of electronic products are proposed. Circuit boards play a key role in the electronic products. If a design of the circuit boards fails to meet requirements of reliability, it will greatly affect the performance of the electronic products.

SUMMARY

The following is a summary of the subject matters described in the present disclosure in detail. The summary is not intended to limit the scope of protection of the claims.

The present disclosure provides a circuit board, a method for preparing the circuit board and an electronic device.

In an aspect, the present disclosure provides a circuit board, including: a substrate, a first wiring layer, a first protective layer, a first conductive ink layer and a first conductive layer sequentially formed on a first surface of the substrate, and a second wiring layer, a second protective layer, a second conductive ink layer and a second conductive layer sequentially formed on a second surface of the substrate opposite to the first surface; the first wiring layer includes a first ground wiring, and the second wiring layer includes a second ground wiring; the first protective layer includes at least one first opening for exposing the first ground wiring of the first wiring layer; the first conductive ink layer is electrically connected with the first ground wiring through the first opening, and an orthographic projection of the first conductive ink layer on the substrate covers an orthographic projection of the first opening on the substrate; the second protective layer includes at least one second opening for exposing the second ground wiring of the second wiring layer; the second conductive ink layer is electrically connected with the second ground wiring through the second opening, and an orthographic projection of the second conductive ink layer on the substrate covers an orthographic projection of the second opening on the substrate; and the first conductive layer is electrically connected with the first conductive ink layer and covers the first conductive ink layer, and the second conductive layer is electrically connected with the second conductive ink layer and covers the second conductive ink layer.

In another aspect, the present disclosure provides a method for preparing a circuit board, including: forming a first wiring layer on a first surface of a substrate, and forming a second wiring layer on a second surface of the substrate opposite to the first surface; forming a first protective layer at a side of the first wiring layer away from the substrate, and forming a second protective layer at a side of the second wiring layer away from the substrate; forming a first conductive ink layer at a side of the first protective layer away from the substrate, and forming a second conductive ink layer at a side of the second protective layer away from the substrate; and forming a first conductive layer at a side of the first conductive ink layer away from the substrate, and forming a second conductive layer at a side of the second conductive ink layer away from the substrate. Wherein, the first wiring layer includes a first ground wiring, and the second wiring layer includes a second ground wiring. The first protective layer includes at least one first opening for exposing the first ground wiring of the first wiring layer, and the second protective layer includes at least one second opening for exposing the second ground wiring of the second wiring layer. The first conductive ink layer is electrically connected with the first ground wiring through the first opening, and an orthographic projection of the first conductive ink layer on the substrate covers an orthographic projection of the first opening on the substrate. The second conductive ink layer is electrically connected with the second ground wiring through the second opening, and an orthographic projection of the second conductive ink layer on the substrate covers an orthographic projection of the second opening on the substrate. The first conductive layer is electrically connected with the first conductive ink layer and covers the first conductive ink layer, and the second conductive layer is electrically connected with the second conductive ink layer and covers the second conductive ink layer.

In another aspect, the present disclosure provides an electronic device, including the circuit board as described above.

Other aspects may be understood upon reading and understanding of the drawings and the detailed description.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure and not intended to form limitations on the technical solutions of the present disclosure.

DETAILED DESCRIPTION

Multiple embodiments are described in the present disclosure. However, the description is exemplary and unrestrictive. Moreover, it is apparent to those of ordinary skills in the art that there may be more embodiments and implementation solutions in the scope of the embodiments described in the present disclosure. Although a number of possible combinations of features are shown in the drawings and discussed in the embodiments, many other combinations of the disclosed features are also possible. Unless specifically restricted, any feature or element of any embodiment may be used in combination with any other feature or element in any other embodiment, or may take the place of any other feature or element in any other embodiment.

The present disclosure includes and conceives combinations of features and elements well known to those of ordinary skills in the art. The embodiments, features, and elements disclosed in the present disclosure may also be combined with any conventional feature or element to form a unique scheme defined by the claims. Any feature or element of any embodiment may also be combined with a feature or an element from another scheme to form another unique scheme defined by the claims. Therefore, it should be understood that any feature shown or discussed in the present disclosure may be implemented independently or in any appropriate combination. Therefore, no other limits are made to the embodiments, besides limits made by the appended claims and equivalent replacements thereof. In addition, one or more modifications and alterations may be made within the protection scope of the appended claims.

In addition, when a representative embodiment is described, a method or a process may already be presented as a specific order of steps in the specification. However, the method or the process should not be limited to the steps of the specific order on the premise that the method or the process is independent of the specific order of the steps. As understood by those of ordinary skills in the art, other orders of steps are also possible. Therefore, the specific order of the acts described in the specification should not be explained as a limitation on the claims. Moreover, execution of the steps of the method of the process in the claims for the method or the process should not be limited to the orders described, and it may be easily understood by those skilled in the art that these orders may be changed and still fall within the spirit and scope of the embodiments of the present disclosure.

In the drawings, a size of a constituent element, or a thickness of a layer or an area, is sometimes exaggerated for clarity. Therefore, an implementation of the present disclosure is not necessarily limited to the size shown, and a shape and size of each component in the drawings do not reflect true proportions. In addition, the drawings schematically illustrate ideal examples, and a mode of the present disclosure is not limited to the shapes, numerical values, or the like shown in the drawings.

Unless otherwise defined, technical terms or scientific terms used in the present disclosure have the same meanings as commonly understood by those of ordinary skills in the art to which the present disclosure belongs. "First", "second", and similar terms used in the present disclosure do not represent any order, number, or significance but are only used to distinguish different components. In the present disclosure, "multiple" may refer to two or more than two. The wording "comprise" or "include", etc. means that an element or article that precedes the word is inclusive of the element or article listed after the word and equivalents thereof, but does not exclude other elements or articles. Similar terms such as "connect", "couple" or "link" are not limited to physical or mechanical connections, but may include electrical connections, whether direct or indirect. "Electrical connection" includes a case where constituent elements are connected together through an element with a certain electrical action. "The element with the certain electric action" is not particularly limited as long as electric signals between the connected constituent elements may be sent and received. Examples of "the element with the certain electrical action" not only include electrodes and wirings, but also switching elements such as transistors, resistors, inductors, capacitors, and other elements with one or more functions.

In the present disclosure, "film" and "layer" are interchangeable. For example, sometimes "conductive layer" may be replaced by "conductive film". Similarly, sometimes "insulating film" may be replaced by "insulating layer".

For keeping the following description of the embodiments of the present disclosure clear and concise, detailed descriptions about part of known functions and known components are omitted in the present disclosure. The drawings of the embodiments of the present disclosure only involve the structures involved in the embodiments of the present disclosure, and other structures may refer to conventional designs.

Embodiments of the present disclosure provide a circuit board, a method for preparing the circuit board and an electronic device, which may improve ground performance of the circuit board, thereby enhancing stability and reliability of the electronic device.

An embodiment of the present disclosure provides a circuit board, which includes a substrate, a first wiring layer, a first protective layer, a first conductive ink layer and a first conductive layer which are sequentially formed on a first surface of the substrate, and a second wiring layer, a second protective layer, a second conductive ink layer and a second conductive layer which are sequentially formed on a second surface of the substrate. The first surface and the second surface are two opposite surfaces. The first wiring layer includes a first ground wiring, and the second wiring layer includes a second ground wiring. The first protective layer includes at least one first opening to expose the first ground wiring of the first wiring layer, the first conductive ink layer is electrically connected with the first ground wiring through the first opening, and an orthographic projection of the first conductive ink layer on the substrate covers an orthographic projection of the first opening on the substrate. The second protective layer includes at least one second opening to expose the second ground wiring of the second wiring layer, the second conductive ink layer is electrically connected with the second ground wiring through the second opening, and an orthographic projection of the second conductive ink layer on the substrate covers an orthographic projection of the second opening on the substrate. The first conductive layer is electrically connected with the first conductive ink layer and covers the first conductive ink layer, and the second conductive layer is electrically connected with the second conductive ink layer and covers the second conductive ink layer.

In some examples, the circuit board according to this embodiment may be a Flexible Printed Circuit board (FPC). However, a type of the circuit board is not limited in this embodiment. In some examples, the circuit board according to this embodiment may be a Printed Circuit Board (PCB) or a Rigid Flex Printed Circuit board (RFPC).

The circuit board according to this embodiment may be a double-sided circuit board. In some examples, the circuit board according to this embodiment may be a multi-layer circuit board, for example, the number of layers of conductive wirings may be two, three or four, etc. This embodiment is not limited to this.

In some exemplary implementations, the circuit board may further include an element disposed on a first surface of the substrate. A distance between the orthographic projection of the first conductive ink layer on the substrate and an orthographic projection of the element on the substrate may be greater than 0.5 mm. In this example, the element and the first wiring layer may be disposed on the same surface of the substrate. Since the first conductive ink layer has conductivity, an influence of the first conductive ink layer on the element disposed on the substrate may be avoided by disposing the first conductive ink layer away from an area where the element is located, thus ensuring stable and reliable performance of the circuit board.

In some examples, the first surface of the substrate may be a front surface of the circuit board, that is, an element surface where the element of the circuit board is disposed, and the second surface may be a back surface of the circuit board, that is, an element-free surface where no element is disposed.

In some examples, the first protective layer may include multiple first openings to expose the first ground wiring of the first wiring layer on the first surface of the substrate. Shapes and sizes of the multiple first openings may be the same or different. However, the number, shapes and sizes of the first openings are not limited in this embodiment.

In some examples, the orthographic projection of the first conductive ink layer on the substrate covers an orthographic projection of the first openings on the substrate, which may include that the orthographic projection of the first conductive ink layer on the substrate coincides with the orthographic projection of the first openings on the substrate, and an area of the orthographic projection of the first conductive ink layer on the substrate is larger than or equal to an area of the orthographic projection of the first openings on the substrate. In some examples, the first conductive ink layer may fill the first openings exposing the first ground wiring. In some examples, the first conductive ink layer may not only fill the first openings exposing the first ground wiring, but also cover the first protective layer around the first openings. In other words, a coverage range of the first conductive ink layer may extend around the first openings in addition to the first openings.

In some examples, the second protective layer may include multiple second openings to expose the second ground wiring of the second wiring layer on the second surface of the substrate. The shapes and sizes of the multiple second openings may be the same or different. The number, shapes and sizes of the second openings are not limited in this embodiment. In some examples, an orthogonal projection of the second openings on the substrate may completely coincide with the orthogonal projection of the first openings on the substrate, that is, the shapes and sizes of the first openings may be the same as those of the second openings. However, this embodiment is not limited to this. In some examples, the orthographic projection of the second openings on the substrate may partially coincide with the orthographic projection of the first openings on the substrate. For example, the size of the second opening may be larger than that of the first opening.

In some examples, the orthographic projection of the second conductive ink layer on the substrate covers the orthographic projection of the second openings on the substrate, which may include that the orthographic projection of the second conductive ink layer on the substrate coincides with the orthographic projection of the second openings on the substrate, and an area of the orthographic projection of the second conductive ink layer on the substrate is larger than or equal to an area of the orthographic projection of the second openings on the substrate. In some examples, the second conductive ink layer may fill the second openings exposing the second ground wiring. In some examples, the second conductive ink layer may not only fill the second openings exposing the second ground wiring, but also cover the second protective layer around the second openings. In other words, a coverage range of the second conductive ink layer may extend around the second openings except the second openings.

In some exemplary implementations, the orthographic projection of the second conductive ink layer on the substrate may at least partially cover the orthographic projection of the first conductive ink layer on the substrate, and an area of the second conductive ink layer may be larger than an area of the first conductive ink layer. In some examples, the orthographic projection of the second conductive ink layer on the substrate may completely cover the orthographic projection of the first conductive ink layer on the substrate, and the area of the second conductive ink layer is larger than the area of the first conductive ink layer. In some examples, the orthographic projection of the second conductive ink layer on the substrate may overlap with the orthographic projection of the first conductive ink layer on the substrate, and the area of the second conductive ink layer may be larger than the area of the first conductive ink layer. However, this embodiment is not limited to this.

In this embodiment, because of double-sided conductivity of the first conductive ink layer, a ground contact area of the front surface of the circuit board may be expanded from the first ground wiring exposed by the first openings as original to the coverage range of the whole first conductive ink layer, so that an influence of a small area of ground wiring exposed by the front surface of the circuit board on ground performance of the front surface of the circuit board may be improved. Because of double-sided conductivity of the second conductive ink layer, a ground contact area of the back surface of the circuit board may be expanded from the second ground wiring exposed by the second openings as original to the coverage range of the whole second conductive ink layer, so that an influence of a small area of the ground wiring exposed by the back surface of the circuit board on ground performance of the back surface of the circuit board may be improved.

In this embodiment, the front surface of the circuit board may be flattened by filling the first openings exposing the first ground wiring with the first conductive ink layer, thus improving an influence of a depression segment difference at a position of the first ground wiring caused by the first openings on the ground performance of the front surface of the circuit board. The back surface of the circuit board may be flattened by filling the second openings exposing the second ground wiring with the second conductive ink layer, thus improving an influence of a depression segment difference at a position of the second ground wiring caused by the second openings on the ground performance of the back surface of the circuit board.

In some examples, the first conductive layer may include an Integrated Circuit (IC) cover tape with conductive adhesive. The IC cover tape may be electrically connected with the first conductive ink layer by a conductive adhesive coated on the IC cover tape. The IC cover tape may be electrically connected with a ground wiring of an external device, thereby providing a ground signal for the first ground wiring through the first conductive ink layer. The first ground wiring may be electrically connected with the second ground wiring through a conductive via penetrating the substrate, thereby providing a grounding signal for the second ground wiring. The second conductive layer may include a heat dissipation film with conductive adhesive (for example, a material of the heat dissipation film may be a metal material). The heat dissipation film may be electrically connected with the second conductive ink layer by a conductive adhesive coated on the heat dissipation film. The heat dissipation film may provide heat dissipation and static discharge functions, thus improving the performance of the circuit board.

In this embodiment, the materials of the first conductive ink layer and the second conductive ink layer may be conductive inks. The conductive ink may be a paste ink made of a conductive material (e.g., gold, silver, copper, etc.) dispersed in a bonding material. For example, the materials of the first conductive ink layer and the second conductive ink layer may include conductive silver ink. Since the conductive ink has good adhesion, the first conductive ink layer may be in sufficient contact with the first ground wiring exposed by the first openings, and the second conductive ink layer may be in sufficient contact with the second ground wiring exposed by the second openings. The circuit board of this embodiment may improve the ground performance between the first ground wiring and the first conductive layer through the first conductive ink layer, and improve the ground performance between the second ground wiring and the second conductive layer through the second conductive ink layer. In some examples, in a case that the first conductive layer includes a sheet-like or strip-like integrated circuit cover tape with a conductive adhesive, tight adhesion between the first ground wiring and the integrated circuit cover tape may be achieved by the first conductive ink layer, so as to avoid a gap or loose adhesion between the integrated circuit cover tape and the first ground wiring, which will affect the ground connection, thus ensuring the ground performance between the first ground wiring and the integrated circuit cover tape.

In some exemplary implementations, the first protective layer may include a first insulating layer, the second protective layer may include a second insulating layer, and materials of the first insulating layer and the second insulating layer may be insulating ink.

In some exemplary implementations, the first protective layer may include a first adhesive layer and the first insulating layer, and the first adhesive layer may be located between the first insulating layer and the first wiring layer. The second protective layer may include a second adhesive layer and the second insulating layer, and the second adhesive layer may be located between the second insulating layer and the second wiring layer. In some examples, a material of the first insulating layer and the second insulating layer may be polyimide (PI), and a material of the first adhesive layer and the second adhesive layer may be an epoxy resin material or an acrylic material.

In some exemplary implementations, the first protective layer may further include: a first Electromagnetic Interference (EMI) shielding layer, which may be formed on a surface of the first insulating layer away from the substrate and electrically connected with the first conductive ink layer. The second protective layer may further include: a second electromagnetic interference shielding layer, which may be formed on a surface of the second insulating layer away from the substrate and electrically connected with the second conductive ink layer. Electromagnetic interference effects of the circuit board may be improved by arrangement of the electromagnetic interference shielding layer, thus improving the performance of the circuit board.

Figure 1:
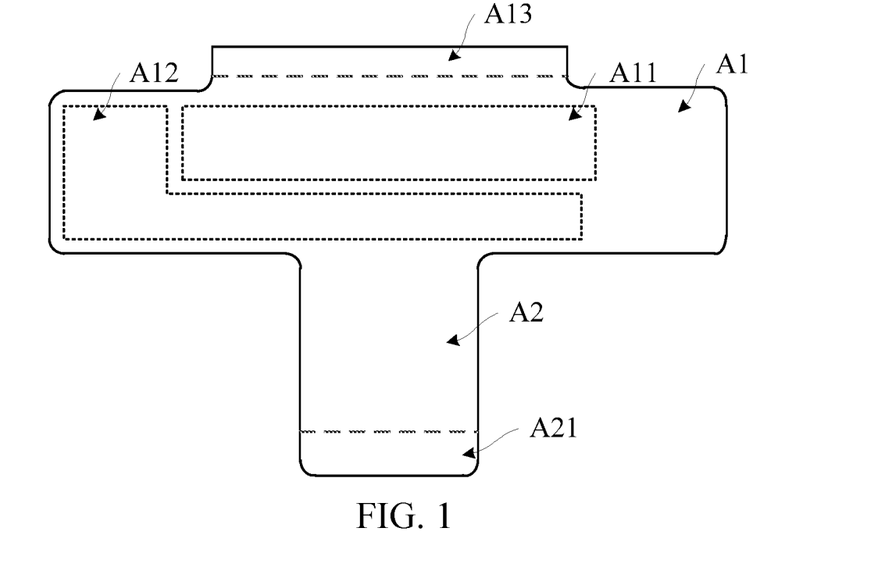
FIG. 1 is a schematic front view of a circuit board according to at least one embodiment of the present disclosure.

FIG. 1 is a schematic front view of a circuit board according to at least one embodiment of the present disclosure. The circuit board of this exemplary embodiment may be a flexible printed circuit board with a double-sided two-layer structure. As shown in FIG. 1, the circuit board of this exemplary embodiment may include a main body A1 and a bent portion A2. A front surface of the main body A1 may include an element region A11, a first ground region A12 and a bonding portion A13. The bonding portion A13 is located at one side of the element region A11. The bonding portion A13 may include multiple conductive fingers. The element region A11 may be provided with devices such as chips, capacitors, resistors and the like. The first ground region A12 may be located at one side of the element region A11. In some examples, there is a certain distance between the first ground region A12 and the element region A11, for example, it may be greater than 0.5 mm, so as to avoid an influence of the first ground region A12 on the elements within the element region A11. In some examples, the first ground region A12 may be used to be connected with a ground wire of an external device, provide a low level to wirings of the circuit board, and lead out charges in the circuit board. In some examples, the first ground region A12 may also extend to a right side of the element region A11, or it may also extend to the bent portion A2 and keep a certain distance from a connector A21. However, this embodiment is not limited to this.

As shown in FIG. 1, the bent portion A2 may include the connector A21 for electrical connection with external signals. In some examples, the circuit board of this embodiment may be applied to a display apparatus, in which the bonding portion A13 is used to achieve electrical connection with a display screen, and the connector A21 is used for connection with a motherboard of an external device.

Figure 2:
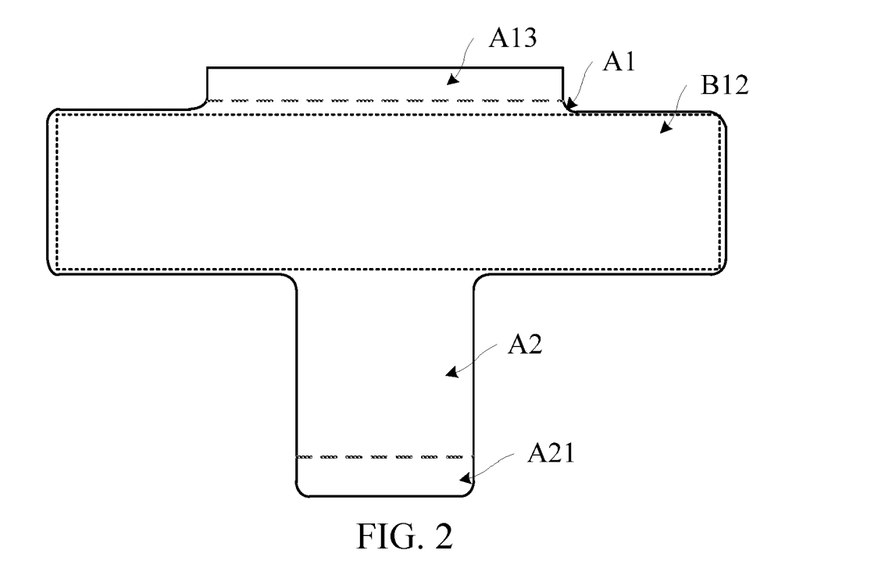
FIG. 2 is a schematic back view of a surface of a circuit board shown in FIG. 1.

FIG. 2 is a schematic back view of a circuit board shown in FIG. 1. As shown in FIG. 2, a back surface of a main body A1 of the circuit board of this exemplary embodiment may include a bonding portion A13 and a second ground region B12. In some examples, the back surface of the main body A1 may all be the second ground region B12 except a region corresponding to the bonding portion A13. In some examples, the second ground region B12 may also extend to a bent portion A2 and keep a certain distance from a connector A21. However, this embodiment is not limited to this.

Figure 3:
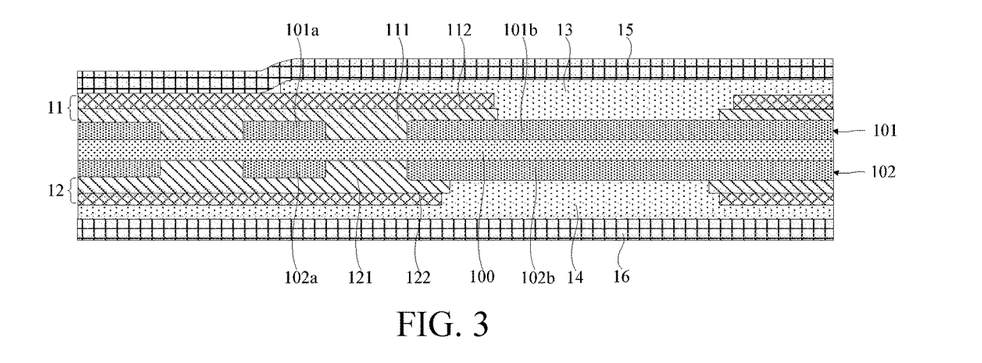
FIG. 3 is a schematic partial sectional view of a circuit board shown in FIG. 1.

FIG. 3 is a schematic partial sectional view of a circuit board shown in FIG. 1. FIG. 3 is a schematic partial sectional view of a main body A1 of a circuit board along a direction perpendicular to a plane of the circuit board. As shown in FIG. 3, in the direction perpendicular to the plane of the circuit board, the circuit board according to this exemplary embodiment may include: a substrate 100, a first wiring layer 101, a first protective layer 11, a first conductive ink layer 13 and a first conductive layer 15 which are sequentially formed on a first surface of the substrate 100, and a second wiring layer 101, a second protective layer 12, a second conductive ink layer 14 and a second conductive layer 16 which are sequentially formed on a second surface of the substrate 100. The first surface and the second surface are two opposite surfaces of the substrate 100. In this example, the first surface of the substrate 100 may be a front surface of the circuit board, an element (not shown) may be disposed on the first surface of the substrate 100, and the second surface of the substrate 100 may be a back surface of the circuit board.

As shown in FIG. 3, the substrate 100 may include a base material layer. In some examples, the substrate 100 may include a base material layer and one or more wiring layers, which may be formed on one surface or two opposite surfaces of the base material layer. The first wiring layer 101 may include multiple first signal wirings 101a and a first ground wiring 101b. The second wiring layer 102 may include multiple second signal wirings 102a and a second ground wiring 102b. The first signal wirings 101a and the second signal wirings 102a may be electrically connected by conductive vias through the substrate 100 to achieve electrical connection, and the first ground wirings 101b and the second ground wirings 102b can be electrically connected by conductive vias penetrating the substrate 100.

As shown in FIG. 3, the first protective layer 11 may include a first opening to expose a surface of a portion of the first ground wiring 101b of the first wiring layer 101, and the first ground wiring 101b exposed by the first opening forms a first ground windowing region. The second protective layer 12 may include a second opening to expose a surface of a portion of the second ground wiring 102b of the second wiring layer 102, and the second ground wiring 102b exposed by the second opening forms a second ground windowing region. In some examples, when a material of the first wiring layer 101 and the second wiring layer 102 is copper, the first ground windowing region and the second ground windowing region are ground regions with exposed copper. In some examples, the second ground windowing region may be larger than the first ground windowing region. However, this embodiment is not limited to this.

As shown in FIG. 3, the first conductive ink layer 13 may be electrically connected with the first ground windowing region through the first opening, and an orthographic projection of the first conductive ink layer 13 on the substrate 100 covers an orthographic projection of the first opening on the substrate 100. The first conductive ink layer 13 fills the first opening and extends around the first opening, covers the first protective layer 11 around the first opening. A thickness of an extended region of the first conductive ink layer 13 on the first protective layer 11 may range from 10 to 20 microns (μm). However, this embodiment is not limited to this.

As shown in FIG. 3, the second conductive ink layer 14 may be electrically connected with the second ground windowing region through the second opening, and an orthographic projection of the second conductive ink layer 14 on the substrate 100 covers an orthographic projection of the second opening on the substrate 100. The second conductive ink layer 14 fills the second opening and extends around the second opening, covers the second protective layer 12 around the second opening. A thickness of an extended region of the second conductive ink layer 14 on the second protective layer 12 may range from 10 to 20 microns. However, this embodiment is not limited to this.

As shown in FIG. 3, the orthographic projection of the second conductive ink layer 14 on the substrate 100 may cover the orthographic projection of the first conductive ink layer 13 on the substrate 100. In this example, an area of the orthographic projection of the second conductive ink layer 14 on the substrate 100 is larger than an area of the orthographic projection of the first conductive ink layer 13 on the substrate 100. However, this embodiment is not limited to this. In some examples, the orthographic projection of the second conductive ink layer 14 on the substrate 100 may partially overlap with the orthographic projection of the first conductive ink layer 13 on the substrate 100.

As shown in FIG. 3, the first protective layer 11 may include a first insulating layer 111 and a first electromagnetic interference shielding layer 112 stacked on the first wiring layer 101. The second protective layer 12 may include a second insulating layer 121 and a second electromagnetic interference shielding layer 122 stacked on the second wiring layer 102. A material of the first insulating layer 111 and the second insulating layer 121 may be insulating ink, for example, Photo Solder Resist (PSR) ink.

As shown in FIG. 3, the first conductive layer 15 is located at a side of the first conductive ink layer 13 away from the substrate 100. The first conductive layer 15 is electrically connected with the first conductive ink layer 13 and covers the first conductive ink layer 13. The second conductive layer 16 is located at a side of the second conductive ink layer 14 away from the substrate 100. The second conductive layer 16 is electrically connected with the second conductive ink layer 14 and covers the second conductive ink layer 14.

In this exemplary embodiment, the circuit board of this embodiment may further include an element. The element is disposed on the first surface of the substrate 100. A distance between the orthographic projection of the first conductive ink layer 13 on the substrate 100 and an orthographic projection of the element on the substrate 100 may be greater than 0.5 mm to avoid an influence of the first conductive ink layer 13 on the element.

In this exemplary embodiment, the first ground region A12 shown in FIG. 1 may be a coverage region of the first conductive ink layer. It may be seen from FIG. 1 that the first conductive ink layer may extend around the first opening on the basis of filling the first opening and keep a certain distance from the element region A11.

In this exemplary embodiment, the second ground region B12 may be a coverage region of the second conductive ink layer. It may be seen from FIG. 2 that the second conductive ink layer may extend around the second opening on the basis of filling the second opening. Combined with FIG. 1 and FIG. 2, it may be seen that an orthographic projection of the second conductive ink layer on the substrate may cover an orthographic projection of the first conductive ink layer on the substrate, and an area of the second conductive ink layer is larger than an area of the first conductive ink layer.

The circuit board of this exemplary embodiment is further illustrated below by an example of a process for preparing the circuit board of this exemplary embodiment. The process for preparing the circuit board according to this exemplary embodiment may include following steps.

Figure 4:
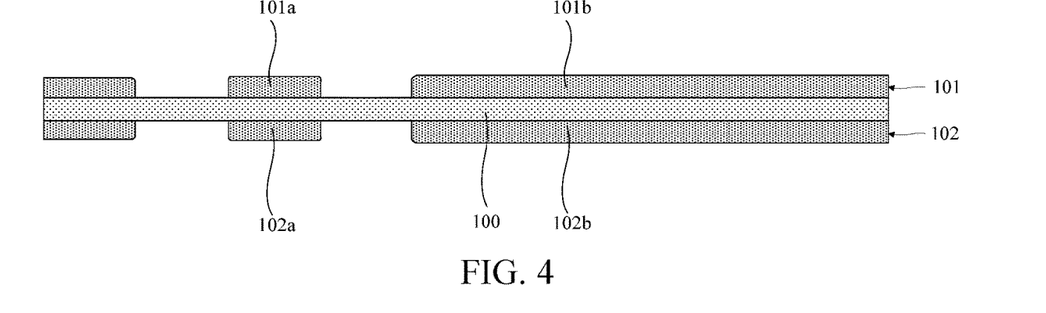
FIG. 4 is a schematic diagram after a first wiring layer and a second wiring layer are formed according to at least one embodiment of the present disclosure.

(1) A first wiring layer and a second wiring layer are formed. As shown in FIG. 4, a first wiring layer 101 and a second wiring layer 102 are formed on two opposite surfaces of a substrate 100. The first wiring layer 101 may include multiple first signal wirings 101a and first ground wirings 101b. The second wiring layer 102 may include multiple second signal wirings 102a and second ground wirings 102b. The first signal wirings 101a and the second signal wirings 102a may be electrically connected by conductive vias penetrating the substrate 100, and the first ground wirings 101b and the second ground wirings 102b may be electrically connected by conductive vias penetrating the substrate 100.

In this example, the substrate 100 includes a base material layer, and a material of the base material layer may be Polyimide (PI), polyether ether ketone, or polyester. A material of the first wiring layer 101 and the second wiring layer 102 may be copper. However, this embodiment is not limited to this.

In some examples, this step may include: providing a double-sided copper-clad substrate (including the base material layer and copper foil layers covering two opposite surfaces of the base material layer); forming at least one via penetrating the base material layer and each copper foil layer on the double-sided copper-clad substrate, for example, the via may be formed by laser drilling; electroplating each via to make an inner layer of the via form a conductive film, so as to form a conductive hole for electrically connecting two copper foil layers and achieve electrical connection between the two copper foil layers; and removing oxides and pollutants on surfaces of the copper foil layers by a chemical method, so that the surfaces of the copper foil layers may meet a roughness required for subsequent dry film pasting. Then, required wirings are etched in the two copper foil layers by exposure and development technologies, thereby the first wiring layer 101 and the second wiring layer 102 are formed. For example, a photosensitive dry film is laminated on the copper foil layers, and then, the wirings are formed on the dry film by ultraviolet irradiation, the dry film which is not irradiated by ultraviolet light is washed away, and the dry film which is polymerized by ultraviolet irradiation is kept, so that the wirings are basically formed; unprotected copper foil is removed to form the wiring layers, and the dry film is stripped off.

Figure 5:
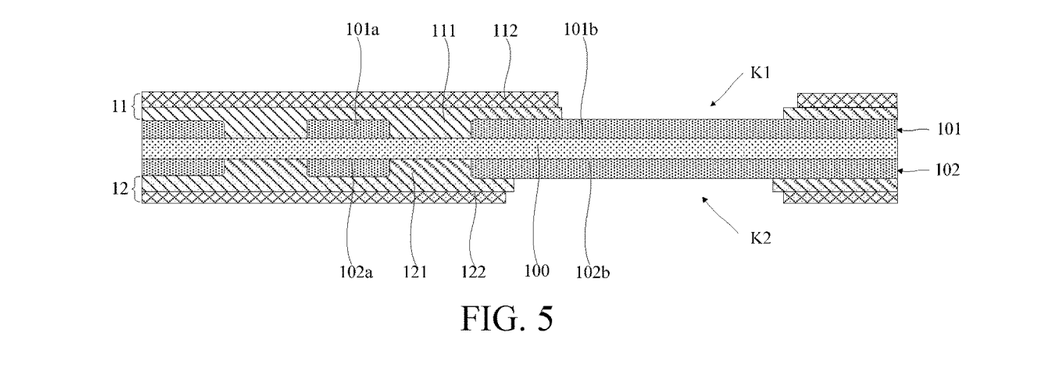
FIG. 5 is a schematic diagram after a first protective layer and a second protective layer are formed according to at least one embodiment of the present disclosure.

(2) A first protective layer 11 is formed on the first wiring layer 101, and a second protective layer 12 is formed on the second wiring layer 102. As shown in FIG. 5, the first protective layer 11 is formed at a side of the first wiring layer 101 away from the substrate 100 and the second protective layer 12 is formed at a side of the second wiring layer 102 away from the substrate 100. In this example, the first protective layer 11 may include: a first insulating layer 111 and a first electromagnetic interference shielding layer 112; the second protective layer 12 may include: a second insulating layer 121 and a second electromagnetic interference shielding layer 122. A material of the first insulating layer 111 and the second insulating layer 121 may be insulating ink, and a material of the first electromagnetic interference shielding layer 112 and the second electromagnetic interference shielding layer 122 may be a metal material, such as silver.

In some examples, the first insulating layer 111 and the second insulating layer 121 (a distance from a top surface of the wiring layer to a top surface of the insulating layer) may both have a thickness greater than 15 microns, for example, 15 to 20 microns. The first electromagnetic interference shielding layer 112 and the second electromagnetic interference shielding layer 122 may both have a thickness which is greater than or equal to 10 microns, for example, the thicknesses of the first electromagnetic interference shielding layer 112 and the second electromagnetic interference shielding layer 122 may both be 15 microns.

In some examples, this step may include: coating insulating ink on a surface of the substrate 100 where the first wiring layer 101 is formed, performing pre-baking to preliminarily cure the insulating ink, exposing and developing the insulating ink, and then completely curing the insulating ink by baking to form the first insulating layer 111. The first insulating layer 111 has a first opening K1, and the first opening K1 may expose a portion of a first ground wiring 101b of the first wiring layer 101 as a first ground windowing region (that is, the ground region with exposed copper in this example). Then, a first electromagnetic interference shielding layer 112 may be formed on the first insulating layer 111 by an electroplating process. A preparation process of the second protective layer 12 may refer to a preparation process of the first protective layer 11, which will not be repeated here.

In some examples, the first insulating layer 111 may have multiple first openings regularly arranged to expose a part of the first ground wiring 101b. In other words, the first ground windowing region may be grid-shaped. However, this embodiment is not limited to this.

In some examples, the first insulating layer 111 and the first electromagnetic interference shielding layer 112 around the first opening K1 may form a stepped edge of the first opening K1, and the first opening K1 may be enlarged along a direction away from the substrate.

However, this embodiment is not limited to this. In some examples, an edge of the first electromagnetic interference shielding layer 112 around the first opening K1 may be aligned with an edge of the first insulating layer 111, that is, a size of the first opening K1 in the direction away from the substrate is uniform. A structure of a second opening K2 is similar to that of the first opening K1, which will not be repeated here.

In some examples, an orthographic projection of the first opening K1 and an orthographic projection of the second opening K2 on the substrate 100 may have different or the same size. In this embodiment, shapes and sizes of the first opening K1 and the second opening K2 are not limited.

Figure 6:
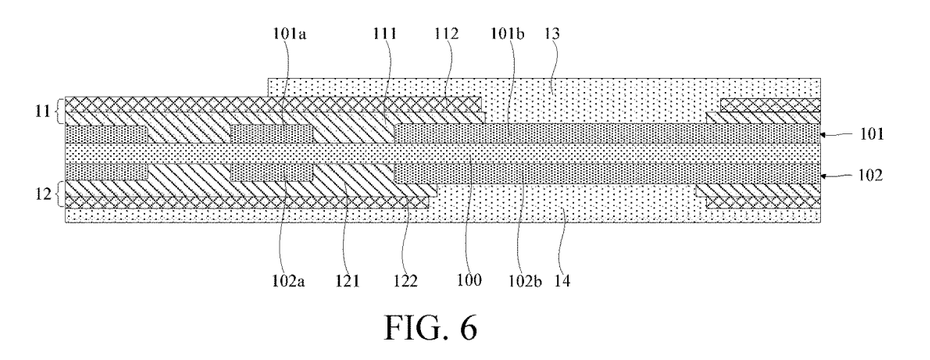
FIG. 6 is a schematic diagram after a first conductive ink layer and a second conductive ink layer are formed according to at least one embodiment of the present disclosure.

(3) A first conductive ink layer 13 and a second conductive ink layer 14 are formed. As shown in FIG. 6, the first conductive ink layer 13 fills the first opening K1 and covers the first insulating layer 111 and the first electromagnetic interference shielding layer 112 around the first opening K1. The first electromagnetic interference shielding layer 112 may be electrically connected with the first ground windowing region through the first conductive ink layer 13. The second conductive ink layer 14 fills the second opening K2 and covers the second insulating layer 121 and the second electromagnetic interference shielding layer 122 around the second opening K2. The first electromagnetic interference shielding layer 122 may be electrically connected with the second ground windowing region through the second conductive ink layer 14. An orthographic projection of the second conductive ink layer 14 on the substrate 100 may cover an orthographic projection of the first conductive ink layer 13 on the substrate 100. In other words, a coverage area of the second conductive ink layer 14 on the second surface of the substrate 100 may be larger than a coverage area of the first conductive ink layer 13 on the first surface of the substrate 100.

In some examples, this step may include: coating conductive silver ink (for example, including silver particles with an average particle size smaller than 100 nm) on the first protective layer 11 to form the first conductive ink layer 13 of the first protective layer 11 covering the first ground windowing region and a periphery of the first ground windowing region, wherein a thickness of the conductive silver ink on the first protective layer 11 may range from 10 to 20 microns. The conductive silver ink is coated on the second protective layer 12 to form a second conductive ink layer 14 of the second protective layer 12 covering the second ground windowing region and a periphery of the second ground windowing region, wherein a thickness of the conductive silver ink on the second protective layer 12 may range from 10 to 20 microns.

In this exemplary embodiment, the first conductive ink layer and the second conductive ink layer are formed, so that the ground contact area of the front surface and the back surface of the circuit board may be enlarged, and the front surface and the back surface of the circuit board may be flattened, thereby improving the ground performance of the circuit board.

In some examples, after this step, surface treatment may be performed on exposed conductive fingers of a bonding portion to form an anti-oxidation layer, thus protecting the exposed conductive fingers. Reinforcing structures are added locally on the circuit board. Text symbols or numbers are printed on the finished surface of the circuit board to indicate the positions of various assembled parts. However, this embodiment is not limited to this.

(4) A first conductive layer 15 and a second conductive layer 16 are formed. As shown in FIG. 3, the first conductive layer 15 is located at a side of the first conductive ink layer 13 away from the substrate 100, and the first conductive layer 15 directly covers the first conductive ink layer 13. The second conductive layer 16 is located at a side of the second conductive ink layer 14 away from the substrate 100, and the second conductive layer 16 directly covers the second conductive ink layer 14.

In some examples, the first conductive layer 15 and the second conductive layer 16 may be formed by pasting sheet-like or strip-like conductive components on surfaces of the first conductive ink layer 13 and the second conductive ink layer 14 away from the substrate 100. In some examples, the first conductive layer 15 may include an integrated circuit cover tape, and the second conductive layer 16 may include a heat dissipation film. The integrated circuit cover tape may be electrically connected with the first conductive ink layer 13 by a conductive adhesive coated on the integrated circuit cover tape, so as to achieve the electrical connection with the first ground wirings 101b. The heat dissipation film may be electrically connected with the second conductive ink layer 14 by a conductive adhesive coated on the heat dissipation film, so as to achieve the electrical connection with the second ground wirings 102b. The circuit board may be electrically connected with a ground line of an external device through the integrated circuit cover tape, and the integrated circuit cover tape may protect a conductive wiring on the circuit board. The circuit board may achieve heat dissipation and static discharge through the heat dissipation film, thus improving the performance of the circuit board.

In this example, the first conductive layer 15 and the first ground wiring 101b are electrically connected by the first conductive ink layer 13, which may increase a ground connection area between the first conductive layer 15 and the first ground wirings 101b, avoid a situation that the first conductive layer 15 cannot be fully connected with the first ground wirings 101b due to a segment difference of the first protective layer 11, and improve ground performance between the first conductive layer 15 and the first ground wirings 101b. The second conductive layer 16 and the second ground wirings 102b are electrically connected by the second conductive ink layer 14, which may increase a ground connection area between the second conductive layer 16 and the second ground wirings 102b, avoid a situation that the second conductive layer 16 cannot be fully connected with the second ground wirings 102b due to a segment difference of the second protective layer 12, and improve ground performance between the second conductive layer 16 and the second ground wirings 102b.

Figure 7:
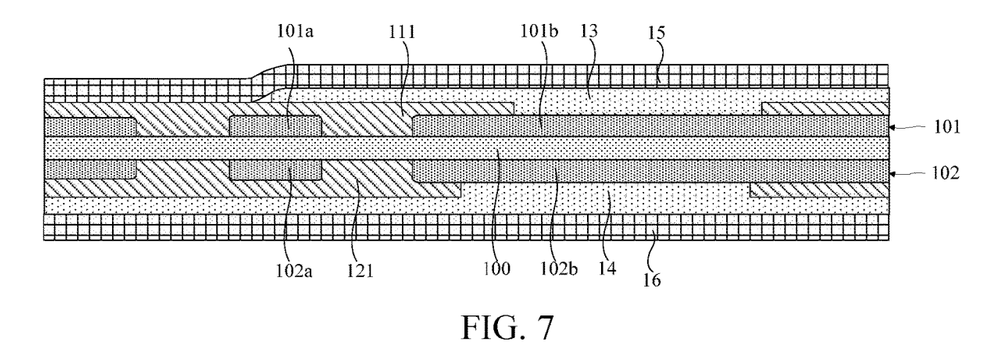
FIG. 7 is an exemplary diagram of a laminated structure of a circuit board according to at least one embodiment of the present disclosure.

FIG. 7 is an exemplary diagram of a laminated structure of a circuit board according to at least one embodiment of the present disclosure. The circuit board of this exemplary embodiment may be an FPC with a double-sided two-layer structure. As shown in FIG. 7, in this exemplary embodiment, a first protective layer may only include a first insulating layer 111, and a second protective layer may only include a second insulating layer 121. The circuit board of this exemplary embodiment is not provided with an electromagnetic interference shielding layer.

For other structure and preparation process of the circuit board according to this exemplary embodiment, reference may be made to the description of the foregoing embodiments, which will not be repeated here. The structure (or method) shown in this embodiment may be combined with structures (or methods) shown in other embodiments as appropriate.

Figure 8:
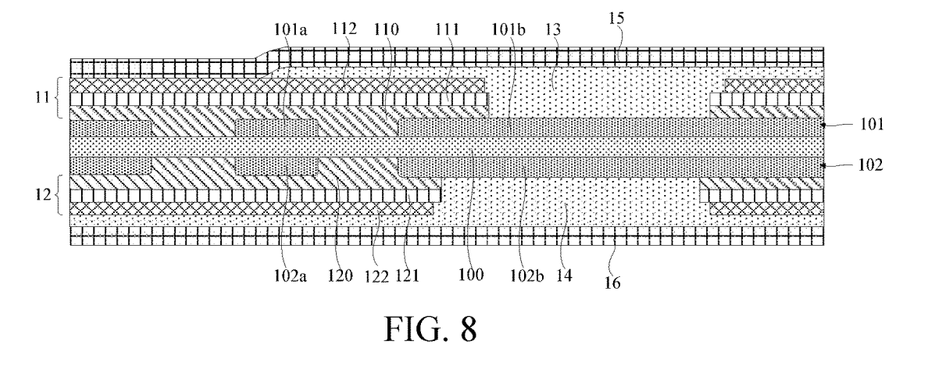
FIG. 8 is another exemplary diagram of a laminated structure of a circuit board according to at least one embodiment of the present disclosure.

FIG. 8 is another exemplary diagram of a laminated structure of a circuit board according to at least one embodiment of the present disclosure. The circuit board of this exemplary embodiment may be an FPC with a double-sided two-layer structure. As shown in FIG. 8, in this exemplary embodiment, a first protective layer 11 may include a first adhesive layer 110, a first insulating layer 111 and a first electromagnetic interference shielding layer 112. A second protective layer 12 may include a second adhesive layer 120, a second insulating layer 121 and a second electromagnetic interference shielding layer 122. The first adhesive layer 110 may be located between the first wiring layer 101 and the first insulating layer 111, and the first electromagnetic interference shielding layer 112 may be formed at a side of the first insulating layer 111 away from the substrate 100. The second adhesive layer 120 may be located between the second wiring layer 102 and the second insulating layer 121, and the second electromagnetic interference shielding layer 122 may be formed at a side of the second insulating layer 121 away from the substrate 100. In this exemplary embodiment, the materials of the first insulating layer 111 and the second insulating layer 121 may be polyimide, and the materials of the first adhesive layer 110 and the second adhesive layer 120 may be epoxy resin materials or acrylic materials. However, this embodiment is not limited to this.

In some examples, the step of forming the first protective layer 11 and the second protective layer 12 may include: attaching a first Cover Lay (CVL) with a first opening K1 and a second CVL with a second opening K2 to the surfaces of the first wiring layer 101 and the second wiring layer 102, respectively, wherein a CVL include an insulating film and an adhesive; melting the adhesive of the first CVL and the second CVL by using high temperature and high pressure provided by thermocompression, so as to fill gaps between the wirings and tightly combine the copper foil with the insulating film to form the adhesive layer and the insulating layer. Then, the electromagnetic interference shielding layer is formed on the insulating layer by electroplating. However, this embodiment is not limited to this. In some examples, the CVLs may be attached to and pressed on the substrate, and then the first opening and the second opening for exposing the ground copper foil may be respectively processed on the two CLVs by laser or other cutting methods.

In some examples, a total thickness range of the adhesive layer and the insulating layer may be greater than or equal to 27.5 microns, for example, a thickness of the adhesive layer (a distance from a top surface of the wiring layer to a top surface of the adhesive layer) may be 15 microns, and a thickness of the insulating layer may be 12.5 microns. Both the first electromagnetic interference shielding layer 112 and the second electromagnetic interference shielding layer 122 may have a thickness range of being greater than or equal to 10 microns, for example, the thickness of each of the electromagnetic interference shielding layer 112 and the second electromagnetic interference shielding layer 122 may be 15 microns. However, this embodiment is not limited to this.

For other structure and preparation process of the circuit board according to this exemplary embodiment, reference may be made to the description of the foregoing embodiments, which will not be repeated here. The structure (or method) shown in this embodiment may be combined with structures (or methods) shown in other embodiments as appropriate.

Figure 9:
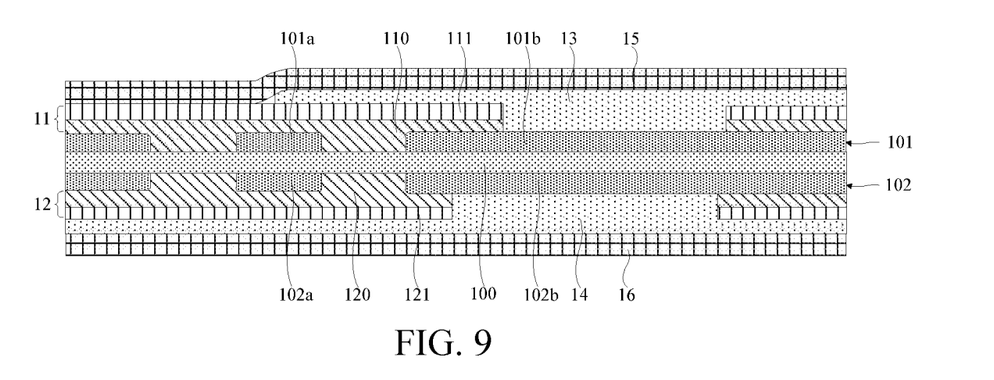
FIG. 9 is another exemplary diagram of a laminated structure of a circuit board according to at least one embodiment of the present disclosure.

FIG. 9 is an exemplary diagram of a laminated structure of a circuit board according to at least one embodiment of the present disclosure. The circuit board of this exemplary embodiment may be an FPC with a double-sided two-layer structure. As shown in FIG. 9, in this exemplary embodiment, a first protective layer 11 may include a first adhesive layer 110 and a first insulating layer 111, and the first adhesive layer 110 is located between a first wiring layer 101 and the first insulating layer 111. A second protective layer 12 may include a second adhesive layer 120 and a second insulating layer 121, and the second adhesive layer 120 is located between a second wiring layer 102 and the second insulating layer 121. The circuit board of this exemplary embodiment is not provided with an electromagnetic interference shielding layer.

For other structure and preparation process of the circuit board according to this exemplary embodiment, reference may be made to the description of the foregoing embodiments, which will not be repeated here. The structure (or method) shown in this embodiment may be combined with structures (or methods) shown in other embodiments as appropriate.

Conductive ink layers may be formed on the front and back surfaces of the circuit board according to the embodiment of the present disclosure thereof for connecting and covering the ground wiring exposed by the protective layer, and electrically connecting the conductive layer and the ground wiring, so that the surface of the conductive layer of the circuit board may be flattened, and the influence of depression of the ground wiring caused by the segment difference of the protective layer on the ground performance between the conductive layer and the ground wiring may be eliminated. In some exemplary embodiments, the conductive ink layer not only covers the ground wiring exposed by the protective layer, but also extends around the ground wiring, thus enlarging the ground contact area and improving the ground performance of the circuit board.

Figure 10:
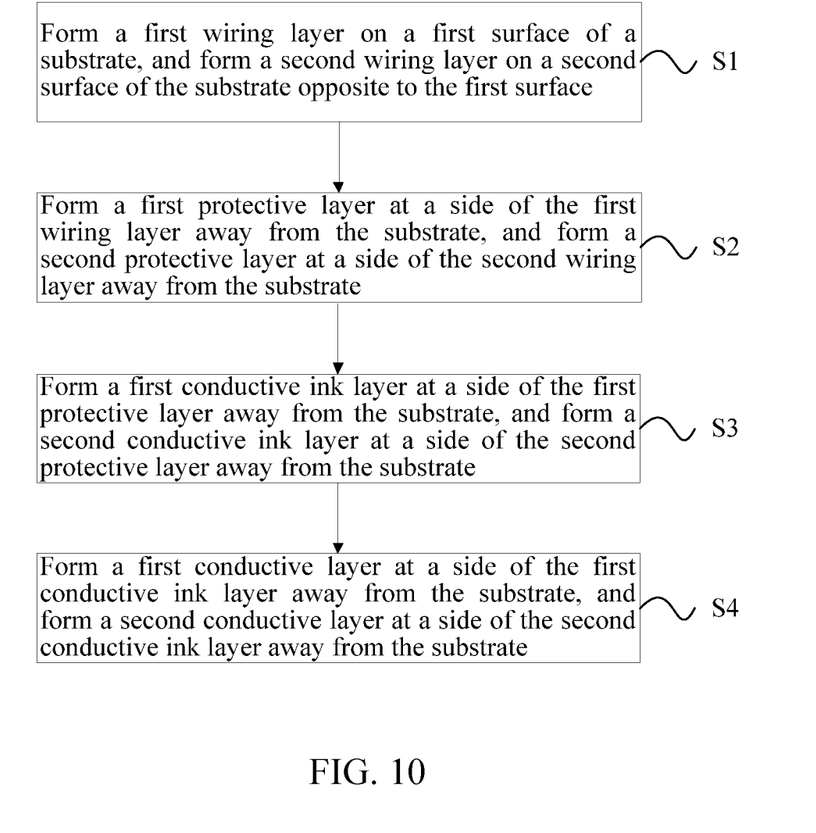
FIG. 10 is a schematic flowchart of a method for preparing a circuit board according to at least one embodiment of the present disclosure.

FIG. 10 is a schematic flowchart of a method for preparing a circuit board according to at least one embodiment of the present disclosure. As shown in FIG. 10, the method for preparing the circuit board according to the embodiment of the present disclosure includes the following steps.

In step S1, a first wiring layer is formed on a first surface of a substrate, and a second wiring layer is formed on a second surface of the substrate opposite to the first surface. The first wiring layer includes a first ground wiring, and the second wiring layer includes a second ground wiring.

In step S2, a first protective layer is formed at a side of the first wiring layer away from the substrate, and a second protective layer is formed at a side of the second wiring layer away from the substrate. The first protective layer includes at least one first opening to expose the first ground wiring of the first wiring layer. The second protective layer includes at least one second opening to expose the second ground wiring of the second wiring layer.

In step S3, a first conductive ink layer is formed at a side of the first protective layer away from the substrate, and a second conductive ink layer is formed at a side of the second protective layer away from the substrate. The first conductive ink layer is electrically connected with the first ground wiring through the first opening, and an orthographic projection of the first conductive ink layer on the substrate covers an orthographic projection of the first opening on the substrate. The second conductive ink layer is electrically connected with the second ground wiring through the second opening, and an orthographic projection of the second conductive ink layer on the substrate covers an orthographic projection of the second opening on the substrate.

In step S4, a first conductive layer is formed at a side of the first conductive ink layer away from the substrate, and a second conductive layer is formed at a side of the second conductive ink layer away from the substrate. The first conductive layer is electrically connected with the first conductive ink layer and covers the first conductive ink layer, the second conductive layer is electrically connected with the second conductive ink layer and covers the second conductive ink layer. In some examples, an integrated circuit cover tape may be directly attached to the side of the first conductive ink layer away from the substrate to form the first conductive layer, and a heat dissipation film is directly attached to the side of the second conductive ink layer away from the substrate to form the second conductive layer.

The process for preparing the circuit board has been described in detail in the foregoing embodiments and will not be repeated here.

According to the method for preparing the circuit board of this embodiment, the conductive ink layers are formed on the front and back surfaces of the circuit board, so that the ground performance of the circuit board may be improved.

An embodiment of the present disclosure further provides an electronic device, including the circuit board as described above. The electronic device may be any product or component such as a touch display apparatus, a mobile phone, a tablet computer, a television, a display, a laptop computer, a digital photo frame, a navigator, and the embodiments of the present disclosure are not limited to this. In some examples, the electronic device may be a touch display apparatus, and the electronic device may include the circuit board of the embodiment as described above, which is configured to support realization of a display function or a touch function. The electronic device according to this embodiment may improve the stability and reliability by use of the circuit board of the embodiment as described above.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the mentioned device or element must have a specific orientation, or be constructed and operated in a particular orientation, and therefore they should not be construed as limitation on the present disclosure.

Although the implementations of the present disclosure are disclosed above, the contents are only implementations used for ease of understanding of the present disclosure and not intended to limit the present disclosure. Those skilled in the art may make any modifications and variations to implementation forms and details without departing from the spirit and scope disclosed by the present disclosure. However, the scope of patent protection of the present disclosure should also be subject to the scope defined by the appended claims.

The invention claimed is:

1. A circuit board, comprising:
a substrate, a first wiring layer, a first protective layer, a first conductive ink layer and a first conductive layer sequentially formed on a first surface of the substrate, and a second wiring layer, a second protective layer, a second conductive ink layer and a second conductive layer sequentially formed on a second surface of the substrate opposite to the first surface, wherein:
the first wiring layer comprises a first ground wiring, and the second wiring layer comprises a second ground wiring;
the first protective layer comprises at least one first opening for exposing the first ground wiring of the first wiring layer, the first conductive ink layer is electrically connected with the first ground wiring through the at least one first opening, and an orthographic projection of the first conductive ink layer on the substrate covers an orthographic projection of the at least one first opening on the substrate;
the second protective layer comprises at least one second opening for exposing the second ground wiring of the second wiring layer, the second conductive ink layer is electrically connected with the second ground wiring through the at least one second opening, and an orthographic projection of the second conductive ink layer on the substrate covers an orthographic projection of the at least one second opening on the substrate;
the first conductive layer is electrically connected with the first conductive ink layer and covers the first conductive ink layer, and the second conductive layer is electrically connected with the second conductive ink layer and covers the second conductive ink layer; and
the orthographic projection of the second conductive ink layer on the substrate at least partially covers the orthographic projection of the first conductive ink layer on the substrate, and an area of the second conductive ink layer is larger than an area of the first conductive ink layer.

2. The circuit board according to claim 1, further comprising: an element disposed on the first surface, and a distance between the orthographic projection of the first conductive ink layer on the substrate and an orthographic projection of the element on the substrate is greater than 0.5 mm.

3. The circuit board according to claim 1, wherein the first conductive ink layer fills the at least one first opening and covers the first protective layer around the at least one first opening, and the second conductive ink layer fills the second opening and covers the second protective layer around the second opening.

4. The circuit board according to claim 1, wherein materials of the first conductive ink layer and the second conductive ink layer comprise conductive silver ink.

5. The circuit board according to claim 1, wherein the first protective layer comprises a first insulating layer, the second protective layer comprises a second insulating layer, and materials of the first insulating layer and the second insulating layer comprise insulating ink.

6. The circuit board according to claim 1, wherein the first protective layer comprises a first adhesive layer and a first insulating layer, and the first adhesive layer is located between the first insulating layer and the first wiring layer; the second protective layer comprises a second adhesive layer and a second insulating layer, and the second adhesive layer is located between the second insulating layer and the second wiring layer.

7. The circuit board according to claim 5, wherein the first protective layer further comprises a first electromagnetic interference shielding layer which is formed on a surface of the first insulating layer away from the substrate and is electrically connected with the first conductive ink layer; and
the second protective layer further comprises a second electromagnetic interference shielding layer which is formed on a surface of the second insulating layer away from the second surface of the substrate and is electrically connected with the second conductive ink layer.

8. A method for preparing a circuit board, comprising:
forming a first wiring layer on a first surface of a substrate, and forming a second wiring layer on a second surface of the substrate opposite to the first surface; wherein the first wiring layer comprises a first ground wiring, and the second wiring layer comprises a second ground wiring;
forming a first protective layer at a side of the first wiring layer away from the substrate, and forming a second protective layer at a side of the second wiring layer away from the substrate; wherein the first protective layer comprises at least one first opening for exposing the first ground wiring of the first wiring layer, and the second protective layer comprises at least one second opening for exposing the second ground wiring of the second wiring layer;
forming a first conductive ink layer at a side of the first protective layer away from the substrate, and forming a second conductive ink layer at a side of the second protective layer away from the substrate; wherein the first conductive ink layer is electrically connected with the first ground wiring through the at least one first opening, and an orthographic projection of the first conductive ink layer on the substrate covers an orthographic projection of the first opening on the substrate; the second conductive ink layer is electrically connected with the second ground wiring through the at least one second opening, and an orthographic projection of the second conductive ink layer on the substrate covers an orthographic projection of the second opening on the substrate; and
forming a first conductive layer at a side of the first conductive ink layer away from the substrate, and forming a second conductive layer at a side of the second conductive ink layer away from the substrate; the first conductive layer is electrically connected with the first conductive ink layer and covers the first conductive ink layer, and the second conductive layer is electrically connected with the second conductive ink layer and covers the second conductive ink layer, wherein the orthographic projection of the second conductive ink layer on the substrate at least partially covers the orthographic projection of the first conductive ink layer on the substrate, and an area of the second conductive ink layer is larger than an area of the first conductive ink layer.

9. An electronic device, comprising the circuit board according to claim 1.

10. The circuit board according to claim 6, wherein the first protective layer further comprises a first electromagnetic interference shielding layer which is formed on a surface of the first insulating layer away from the substrate and is electrically connected with the first conductive ink layer; and the second protective layer further comprises a second electromagnetic interference shielding layer which is formed on a surface of the second insulating layer away from the second surface of the substrate and is electrically connected with the second conductive ink layer.

11. An electronic device, comprising the circuit board according to claim 2.

12. An electronic device, comprising the circuit board according to claim 3.

13. An electronic device, comprising the circuit board according to claim 4.

14. An electronic device, comprising the circuit board according to claim 5.

15. An electronic device, comprising the circuit board according to claim 6.

16. An electronic device, comprising the circuit board according to claim 7.

* * * * *